United States Patent [19]
Dai et al.

[11] Patent Number: 5,604,157
[45] Date of Patent: Feb. 18, 1997

[54] REDUCED NOTCHING OF POLYCIDE GATES USING SILICON ANTI REFLECTION LAYER

[75] Inventors: Chang-Ming Dai; Jau-Hwang Ho; Lou G. Chine, all of Hsinchu, Taiwan

[73] Assignee: Industrial Technology Research Institute, Hsinchu, Taiwan

[21] Appl. No.: 450,301

[22] Filed: May 25, 1995

[51] Int. Cl.$^6$ .................................................. H01L 21/28
[52] U.S. Cl. ............................ 437/200; 437/193; 437/41
[58] Field of Search ........................... 437/41, 193, 200, 437/233

[56] References Cited

U.S. PATENT DOCUMENTS

| | | | |
|---|---|---|---|
| 4,740,484 | 4/1988 | Norstrom et al. | 437/200 |
| 4,782,033 | 11/1988 | Gierish et al. | 437/200 |
| 4,933,304 | 6/1990 | Chen et al. | 437/194 |
| 4,935,380 | 6/1990 | Okumuro | 437/200 |
| 5,068,697 | 11/1991 | Noda | 257/23.5 |
| 5,139,974 | 8/1992 | Sandhu et al. | 437/228 |
| 5,302,538 | 4/1994 | Ishikowa et al. | 437/200 |
| 5,312,780 | 5/1994 | Nanda et al. | 437/238 |
| 5,441,914 | 8/1995 | Taft et al. | 437/200 |
| 5,498,558 | 3/1996 | Kepoor | 437/193 |

FOREIGN PATENT DOCUMENTS

| | | |
|---|---|---|
| 390509 | 10/1990 | European Pat. Off. . |
| 01041245 | 2/1989 | Japan . |
| 04007822 | 1/1992 | Japan . |

OTHER PUBLICATIONS

S. Wolf "Silicon Processing For the VLSI Era, vol.1", Lattice Press, 1986, pp. 177–184, 207, 208, 325, 326, 556–557.

Czech et al "Reduction of Line Width Variation For the Gate Conductor Level by Lithography Based on a New Antireflective Layer", Microelectronics Enigeering, vol. 21, 1993, pp. 51–56.

Dijkstro et al, "Optimization of Anti–Reflection Layers for Deep UV Lithography," SPIE vol. 1927, Optical/Microlithography VI, 1993, pp. 275–286.

*Primary Examiner*—John Niebling
*Assistant Examiner*—Thomas G. Bilodeau
*Attorney, Agent, or Firm*—George O. Saile

[57] ABSTRACT

A method for fabricating MOSFET devices, with narrow gate structures, and narrow spaces between gate structures, has been developed. The addition of a rough surfaced silicon layer, as part of the gate structure, minimizes the amount of reflective and scattered light, resulting during the gate photolithographic processing. The reduction in reflective and scattered greatly enhances the ability to achieve sub-micron lines and spaces. The rough surfaced silicon can remain as a part of the gate structure, and is obtained by chemical vapor deposition of either an amorphous silicon, or a hemispherical grained silicon film.

17 Claims, 3 Drawing Sheets

REDUCED NOTCHING OF POLYCIDE GATES USING SILICON ANTI REFLECTION LAYER

BACKGROUND OF THE INVENTION

1. Field of the Invention

The present invention relates to the fabrication methods used for semiconductor devices, and more specifically to the process used to, achieve narrow polycide gate dimensions.

2. Description of Prior Art

The semiconductor chip industry is continually striving to reduce costs, while still increasing circuit performance. These objectives have been met by the ability of the industry to reduce critical chip images to sub-micron dimensions resulting in more chips per silicon wafer, thus reducing cost. In addition the reduction of critical chip dimensions has also resulted in improved device performance. For example the performance of conventional metal oxide semiconductor, field effect transistors, (MOSFET), devices is strongly dependent on the critical dimension of the gate image. The device performance increases as the channel length decreases. The requirement to produce narrow gate features, with close spacing between adjacent features, is strongly dependent on the photolithographic processes used in the chip fabrication process. Advances in the photolithography technology have been achieved via more sophisticated cameras, allowing for greater resolution, in photoresist materials, to be achieved. In addition the development of more high contrast photoresist materials has also contributed to the trend to smaller images. However a problem caused by the reflectivity of materials, underlying the photoresist, have caused degradation to occur in the photoresist images through reflective light scattering.

The light scattering phenomena, resulting in the degradation of the desired photoresist image, is not only a function of the underlying material causing the undesirable reflections, but is also influenced by the topography of the structure the photoresist image is to be generated on. For example thick field oxides, used for device isolation purposes, result in topographies that adversely effect subsequent photoresist imaging. Specifically the critical dimension of the MOSFET gate, in turn influencing the critical channel length dimension, can be difficult to achieve due to light scattering during photoresist exposures. The reflectivity of specific materials, overlying the severe topography created by the thick field oxide, is increased due to this topography. The solution to the topography problem is to either use chemical-mechanical polishing to reduce the topography, or to use a shallow trench oxide isolation process. Both of the above solutions result in increased process complexity and cost.

Another solution to the scattered light phenomena is the use of an anti-reflective coating, (ARC), layer, which reduces or minimizes the magnitude off reflective light and thus allows critical dimensions in photoresist to be achieved. There are several options for the use of ARC layers. For example the use of a TiN layer, inserted between the photoresist and the underlying gate material, has found much use in the fabrication of MOSFET chips. However this option adds considerable cost to the product since the TiN used is disposable. That is after the resist image has been used as a mask to define the underlying gate structure the TiN has to be removed. It should also be noted that device performance can also be degraded due to the presence of metallic ions sometimes found in TiN layers. In addition the adhesion between the photoresist and the TiN ARC layer has to be considered. Another version of an ARC layer described by Chen, etal, in U.S. Pat. No. 4,933,304 uses a "roughened" surface of a metal layer, between the photoresist and the underlying gate material. Sandhu, etal, in U.S. Pat. No. 5,139,974 also describe a process for decreasing the optical reflectivity of a metal layer by "roughening" the metal surface. The roughened surface reduces reflections from the underlying gate material that would otherwise result in light scattering and undesirable exposure of the critical photoresist dimension. The step of toughening the surface includes deposition of an additional metal film and a plasma step to form the uneven surface. Again these steps add complexity and cost to the product, and can sometimes result in device performance degradation.

The invention now to be described uses ASPARC, (an Amorphous Silicon film on Polycide gates as an Anti-Reflective Coating). This invention will show two iterations, one in which the ASPARC layer is removed after use, and the other in which the ASPARC film remains as a part of the final gate structure. This process and structure described in this invention are easy to implement and are compatible with the polycide gate process being used.

SUMMARY OF THE INVENTION

It is an object of this invention to provide a method to obtain enhanced control of the critical dimensions, narrow gate polycide lines, with narrow spacings between polycide lines, even when the polycide gates are formed over severe topography.

It is another object of this invention to reduce the optical reflectivity from the underlying gate polycide material during exposure of the critical gate image in the photoresist.

It is still another object of this invention to use amorphous silicon, overlying the polycide gate material, as an anti-reflective coating.

It is still yet another object of this invention to use heel-spherical grained, (HSG), silicon, overlying the polycide gate material, as an anti-reflective coating.

In accordance with this present invention a method is described for fabricating narrow polycide lines, and spacings, on a semiconductor substrate. A thick field oxide is formed in the silicon substrate, followed by the growth of a thin gate oxide via thermal oxidation procedures. A polysilicon deposition, using an in-situ doping process or intrinsic polysilicon followed by an ion implantation process, is than performed. A tungsten silicide layer is next deposited to overlay the polysilicon layer and form the polycide material. An anti-reflective coating of either amorphous silicon, or heel-spherical grained silicon, is than deposited on the polycide material. A layer of chemically vapor deposited, (CVD), oxide is than formed on the ARC surface. Photolithographic procedures are now used to create the desired images in the resist, and are transferred to the underlying oxide, anti-reflective coating and polycide layers via conventional reactive ion etching processes. Another iteration of this invention is to deposit the ARC material on the chemically vapor deposited oxide. Then after photolithographic and reactive ion etch procedures, resist removal is followed by removal of the ARC layer overlying the CVD oxide.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming MOSFET devices with narrow polycide lines and spaces will now be covered in detail. This process for forming the narrow polycide lines and spaces can be used as part of MOSFET devices that are currently being manufactured in industry, therefore only the specific areas unique to understanding this invention will be covered in detail.

Figure 1:
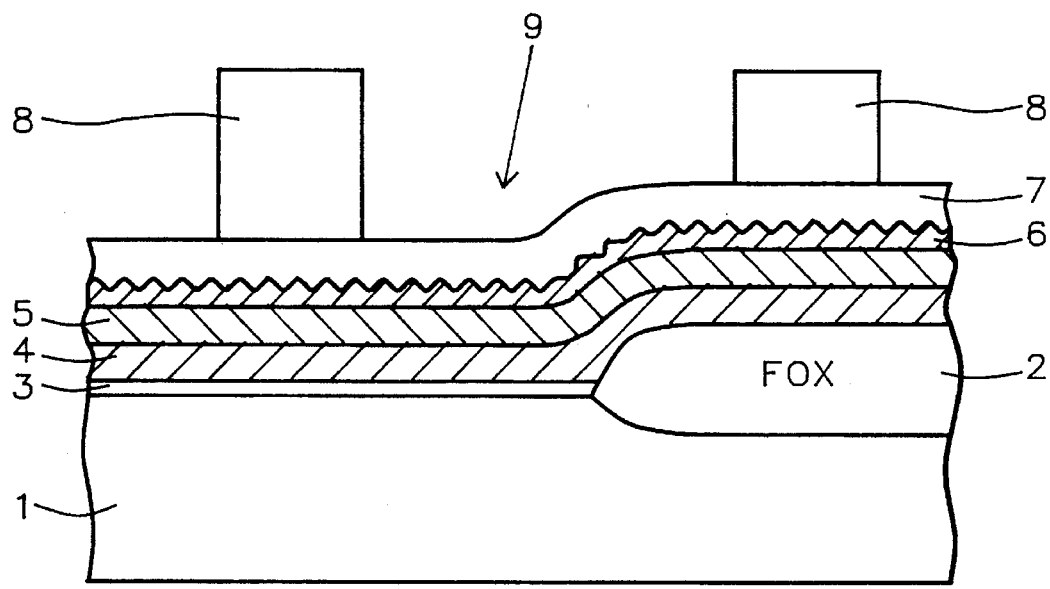
FIG. 1–2, which schematically show cross-sectional views of the fabrication stages used to obtain narrow polycide lines and spacings using a ARC layer as part of the polycide structure.

FIG. 1 shows the layers and structure used for a typical MOSFET device, that will benefit from narrow polycide lines and spaces. A substrate, 1, composed of P type, single crystal silicon with a <100> orientation, is used. A thick field oxide, 2, (FOX), is formed surrounding the region where the device is to be built. Briefly the method used to form the FOX insulator is to use a thin thermal oxide, and a silicon nitride layer, as an oxidation mask. The desired FOX regions are etched opened in the silicon nitride-silicon dioxide layers using conventional photolithographic and reactive ion etching techniques. After removal of the photoresist, and a chemical clean, a field oxide is grown, typically to a thickness of about 4000 to 6000 Angstroms.

After removal of the masking silicon nitride, in hot phosphoric acid, and the silicon dioxide in a buffered hydrofluoric acid solution, a gate oxide, 3, is grown. The gate oxide is obtained thermally in an O2- steam ambient, at a temperature between about 800° to 900° C., to a thickness between about 60 to 160 Angstroms. Next a polysilicon layer, 4, is grown using low pressure chemical vapor deposition, (LPCVD), techniques, at a temperature between about 600° to 640° C., to a thickness between about 1000 to 3000 Angstroms. The polysilicon can be grown using a phosphine, (PH3), in-situ doping process, or it can be grown intrinsic. For the latter a phosphorous ion implantation implantation step is performed, at an energy between about 30 to 60 Kev., and at a dose between about 4E16 to 6E15 atoms/cm2, in order to achieve the desired polysilicon conductivity. A tungsten silicide, (WSix), layer, 5, is now formed on the polysilicon layer, 4. This is accomplished by a LPCVD process carried out at a temperature between about 500° to 650° C., to a thickness between about 1000 to 2000 Angstroms. The WSix layer can also be formed by depositing tungsten on the polysilicon layer and subjecting the structure to an anneal at a temperature between 800° to 900° C. for about 30 to 60 min., to form the metal silicide.

The critical anti-reflective coating, (ARC), 6, is now formed on the polycide material. Two options for the ARC layer are used. First an amorphous silicon layer, (ASPARC), can be deposited using LPCVD processes, at a temperature between about 530° to 600° C., to a thickness between about 300 to 1000 Angstroms. The thickness chosen is crucial since the destruction or cancellation of scattered or reflected light will be optimum at a specific thickness of the ASPARC layer. The roughness of this amorphous film will scatter incident light during subsequent photoresist exposures, and thus minimize unwanted photoresist exposures or notching due to reflective light, specifically in the regions where the severe topography of the FOX region exists. Another form of the ASPARC layer, 6, can be created by growing hemispherical grain, (HSG), silicon, on the polycide surface. This is accomplished by depositing silicon, using LPCVD processing at a temperature between about 550° to 580° C., again to a thickness between about 300 to 1000 Angstroms. The HSG film obtained also has a rough surface, and therefore is effective in reducing the reflected light, occurring during the photolithographic exposure of the polycide gate level. The reduction in reflected light, specifically in the region of the field oxide, allows narrower polycide lines and spaces to be ultimately obtained.

A layer of LPCVD silicon dioxide, 7, is next deposited using tetraethylorthosilicate, (TEOS), at a temperature between about 700° to 750° C., to a thickness between about 1000 to 3000 Angstroms. Photoresist is then applied, exposed and developed, to form the narrow photoresist images, 8, the polycide lines. It should be noted that the narrow spaces, 9, approximately between 0.2 to 1.5 uM, between the polycide images, in particular over the FOX topography, would have been difficult to control if not for the ASPARC layer, minimizing reflective light and thus minimizing notching of the polycide image.

Figure 2:
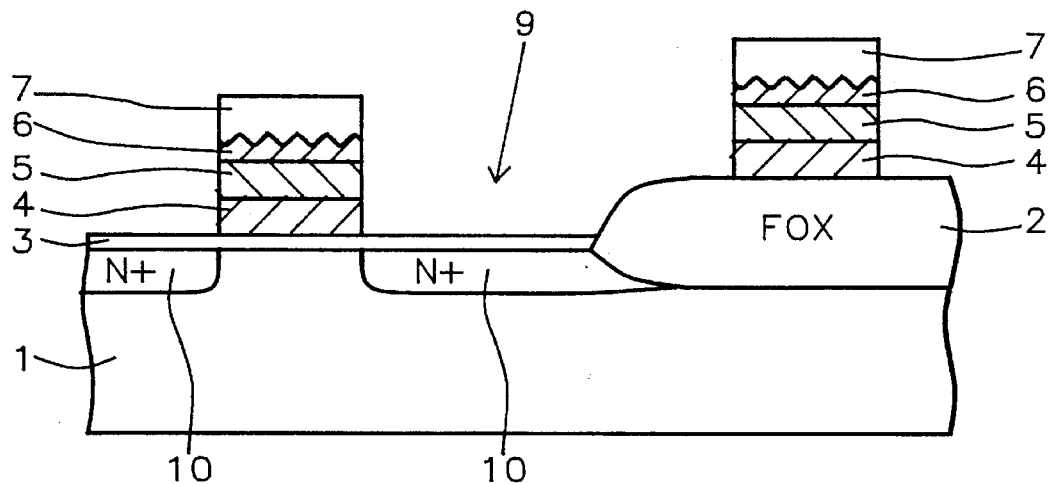

The result of RIE, processing used to transfer the photoresist images, 8, to the underlying insulator and polycide structures is shown in FIG. 2. The RIE is accomplished by using CHF3 for the TEOS film, 7, while SF6 is used to pattern the amorphous or HSG silicon layer, 6, as well as the WSix layer, 5, and the polysilicon, 4. FIG. 2 shows the structure after photoresist removal. Also shown in FIG. 2 are the N+ source and drain regions, 10, obtained via an arsenic ion implantation at an energy between about 50 to 80 Kev., at a dose between about 2 to 5E15 atoms/cm2.

Figure 3:
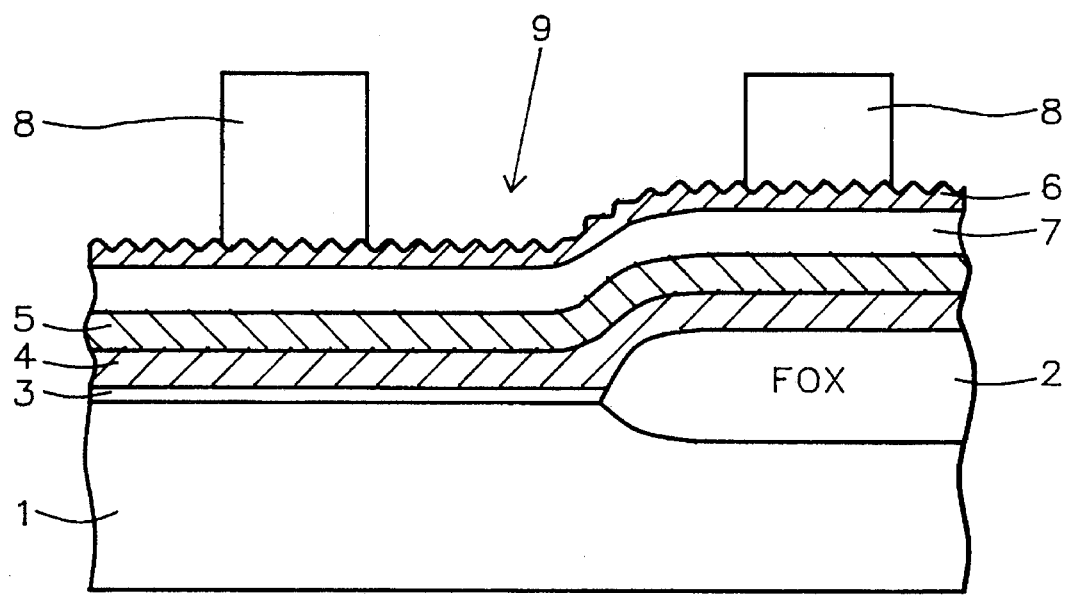
FIGS. 3–5, which schematically show cross-sectional views of the fabrication stages used to obtain narrow polycide lines and spaces, using a disposable ARC layer.
Figure 4:
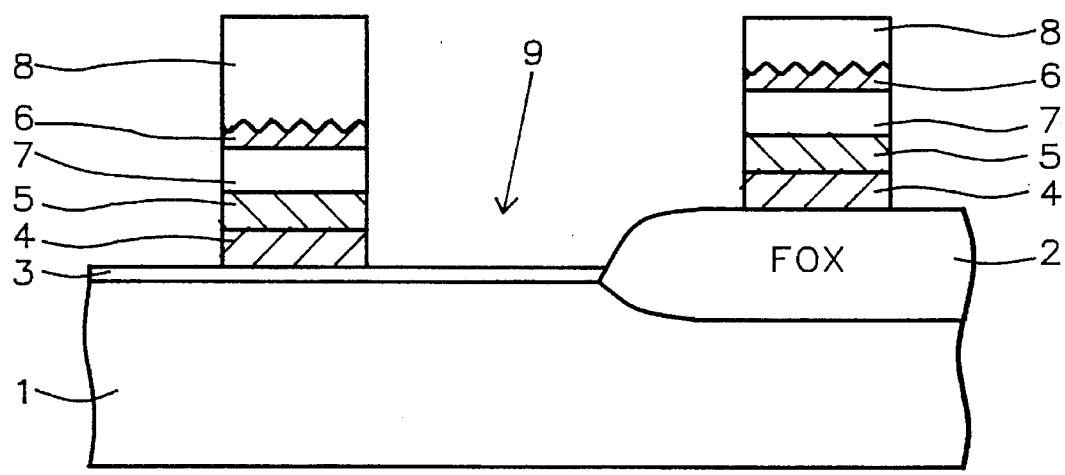
Figure 5:
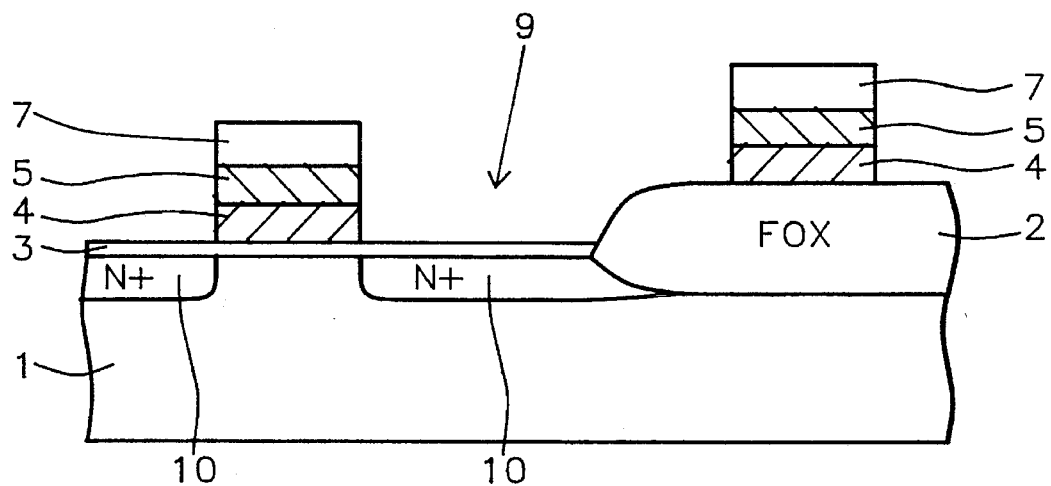

A second iteration using the ASPARC layer is described in FIGS. 3–5. FIG. 3 shows a structure in which the processing is identical to that practiced previously and shown in FIG. 1. However for this iteration the deposition of the ASPARC layer, 6, is formed on the TEOS layer, 7. (The previous iteration consisted of forming the ASPARC layer, 6, overlying the WSix layer, 5, and underlying the TEOS layer, 7. Again the ASPARC layer, 6, can be either an amorphous or hemi-spherical silicon layer, obtained using processing and thicknesses identical to processing and thicknesses previously described. FIG. 4 shows the result of RIE processing, used to successfully transfer the images in the photoresist, 8, to the polycide gate structures. Again the polycide lines and the spaces are accurately obtained and mainly influenced by the ability of the ASPARC layer to prevent reflective components of the photoresist exposure procedure, from distorting or notching the photoresist image, 8, and thus avoiding the subsequent transfer of this notched image to the polycide lines and spaces. The RIE processing used with this iteration is SF6 for the ASPARC layer, CHF3 for TEOS oxide etching, and NF3 for WSix.

FIG. 5 shows the result of resist removal, via use of hot sulfuric acid, and for this case removal of the ASPARC layer, 6, using a blanket SF6 RIE process. (In the previous iteration the ASPARC layer remained as part of the polycide structure). Self aligned source and drain regions, 10, are again formed using ion implantation conditions described previously. It should be noted that the TEOS oxide, overlying the polycide structure prevents the source and drain ion implantation from penetrating the polycide gate structure.

Figure 6:
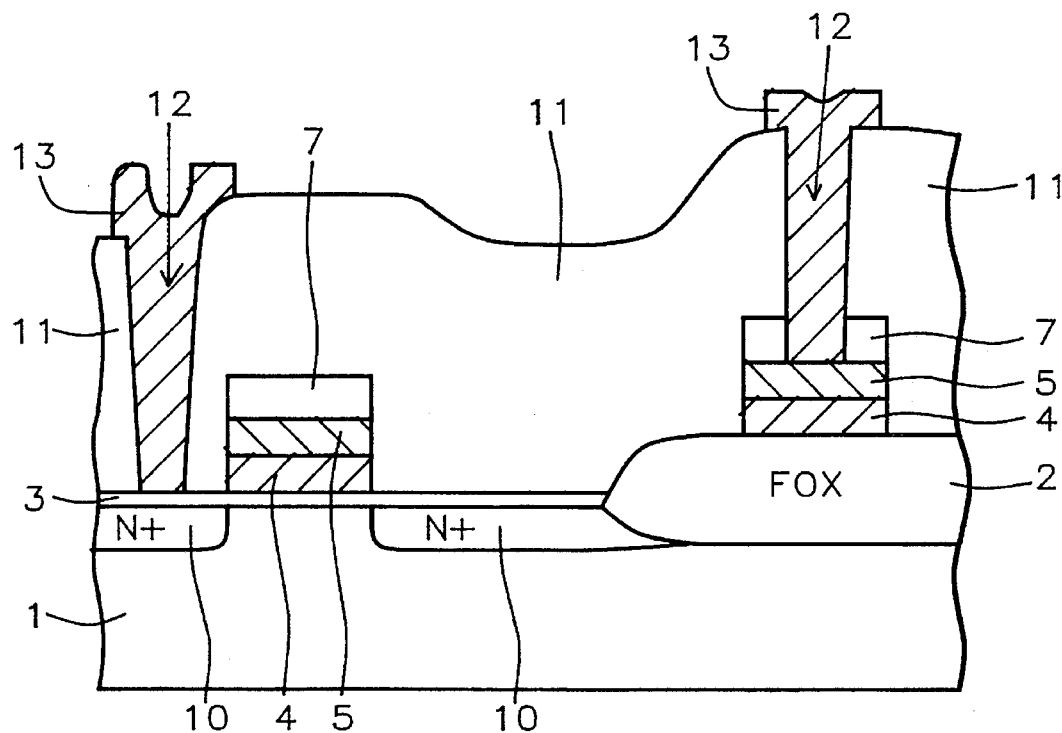
FIG. 6, which schematically shows a cross-sectional view of a final fabrication stage used to obtain MOSFET devices with narrow polycide lines and spaces.

Finally FIG. 6 shows a metallized MOSFET device in which narrow polycide gate structures and spaces were obtained using an ASPARC layer. A CVD oxide, 11, is deposited on the structure shown in FIG. 5, to a thickness between about 2000 to 5000 Angstroms. Standard photolithographic and reactive ion etching processing are then used to form vias, or contact holes, 12, to source and drain regions, 10, and to a polycide gate structure. The deposition of Ti—TiN—AlSiCu—TiN is next performed using sputtering to a thickness between about 4000 to 8000 Angstroms. Standard photolithographic and reactive ion etching procedures are then used to form the metal structures, 13.

The process for reducing notching of polycide gate structures, via the use of specific anti-reflective coatings, although shown as part of a N type FET, (NFET), can also be applied to P type, (PFET), devices as well as to CMOS (complimentary MOS) structures. In addition BiCMOS, (bipolar-CMOS), devices can also be fabricated using this invention.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a MOSFET device on a semiconductor substrate, using an anti-reflective layer, as part of a photolithographic mask, to create a pattern of gate polycide lines and spaces, comprising the steps of:

forming a field oxide region on specific portions of said substrate, while leaving bare silicon on remaining portions of said substrate;

growing a gate oxide on said bare silicon;

depositing a polysilicon layer on said gate oxide, and on said field oxide regions;

forming a metal silicide layer on said polysilicon layer;

depositing said anti-reflective layer, comprised of a hemi-spherical grain, silicon layer, on said metal silicide layer, at a temperature between about 550° and 580° C., to a thickness between about 300 and 1000 Angstroms;

depositing an oxide layer on said hemi-spherical grain, silicon layer;

patterning, to form polycide gate structure on said field oxide region and on said gate oxide; and ion implanting a first conductivity imparting dopant into regions not covered by said polycide gate structure.

2. The method of claim 1, wherein said gate oxide is grown at a temperature between about 800° and 900° C., to a thickness between about 60 and 160 Angstrom.

3. The method of claim 1, wherein said polysilicon is grown at a temperature between about 600° and 640° C., to a thickness between about 1000 and 3000 Angstroms, and insitu doped with phosphine to a concentration between about 1E20 to 1E21 atoms/cm3.

4. The method of claim 1, wherein said metal silicide is tungsten silicide, deposited using LPCVD, at a temperature between about 500° and 650° C., to a thickness between about 1000 and 8000 Angstroms.

5. The method of claim 1, wherein said metal silicide is tungsten silicide formed by deposition of tungsten, and annealed at a temperature between about 800° and 900° C., for between about 30 and 60 min., to form between about 2000 and 4000 Angstroms of tungsten silicide.

6. The method of claim 1, wherein said oxide layer is deposited using LPCVD, at a temperature between about 700° and 750° C., to a thickness between about 1000 and 3000 Angstroms.

7. The method of claim 1, wherein said polycide gate structure is comprised of said oxide layer, said hemi-spherical grain silicon layer, said metal silicide layer, and said polysilicon layer.

8. The method of claim 1, wherein said first conductivity imparting dopant is arsenic, ion implanted at an energy between about 50 and 80 Kev., at a dose between about 8E15 to 5E15 atoms/cm2.

9. A method of fabricating a MOSFET device, on a semiconductor substrate, using an anti-reflective layer, as part of a photolithographic mask, to create a pattern of gate polycide lines and spaces, comprising the steps of:

forming a field oxide region on specific portions of said substrate, while leaving bare silicon on remaining portions of said substrate;

growing a gate oxide on said bare silicon;

depositing a polysilicon layer on said gate oxide, and on said field oxide regions;

forming a metal silicide layer on said polysilicon layer;

depositing an oxide layer on said metal silicide layer;

depositing said anti-reflective layer, comprised of a hemi-spherical grain, silicon layer, on said oxide layer, at a temperature between about 550° C. and 580° C., to a thickness between about 300 and 1000 Angstroms;

patterning to form polycide gate structure on said field oxide region and on said gate oxide;

removal of said hemi-spherical grain, silicon layer, and ion implanting a first conductivity imparting dopant into regions not covered by said polycide gate structure.

10. The method of claim 9, wherein said gate oxide is grown at a temperature between about 800° and 900° C., to a thickness between about 60 and 160 Angstrom.

11. The method of claim 9, wherein said polysilicon layer is grown at a temperature between about 600° and 640° C., to a thickness between about 1000 and 3000 Angstroms, and is insitu doped with phosphine, to a concentration between about 1E20 to 1E21 atoms/cm3.

12. The method of claim 9, wherein said metal silicide layer is tungsten silicide, deposited using LPCVD, at a temperature between about 50° and 650° C., to a thickness between about 1000 and 3000 Angstroms.

13. The method of claim 9, wherein said metal silicide is tungsten silicide, formed by deposition of tungsten, and annealed at a temperature between about 800° and 900° C., for between about 30 and 60 min., to form between about 2000 and 4000 Angstroms of tungsten silicide.

14. The method of claim 9, wherein said oxide layer is deposited using LPCVD, at a temperature between about 600° and 750° C., to a thickness between about 1000 and 3000 Angstroms.

15. The method of claim 9, wherein said polycide gate structure is comprised of said oxide layer, said metal silicide layer, and said polysilicon layer.

16. The method of claim 9, wherein said hemi-spherical grain silicon layer is removed via RIE processing using SF6.

17. The method of claim 9, wherein said first conductivity imparting dopant is arsenic, ion implanted at an energy between about 50 and 80 Kev., at a dose between about 2E15 and 5E15 atoms/cm2.

* * * * *